United States Patent
Takada et al.

(10) Patent No.: US 7,804,870 B2
(45) Date of Patent: Sep. 28, 2010

(54) SEMICONDUCTOR OPTICAL DEVICE AND MANUFACTURING METHOD THEREOF

(75) Inventors: Kan Takada, Kawasaki (JP); Mitsuru Ekawa, Kawasaki (JP); Tsuyoshi Yamamoto, Kawasaki (JP); Tatsuya Takeuchi, Yamanashi (JP)

(73) Assignees: Fujitsu Limited, Kawasaki (JP); Sumitomo Electric Device Innovations, Inc., Kanagawa (JP)

( * ) Notice: Subject to any disclaimer, the term of this patent is extended or adjusted under 35 U.S.C. 154(b) by 0 days.

(21) Appl. No.: 12/053,213

(22) Filed: Mar. 21, 2008

(65) Prior Publication Data

US 2008/0240191 A1      Oct. 2, 2008

(30) Foreign Application Priority Data

Mar. 28, 2007   (JP) .................... 2007-084593

(51) Int. Cl.
   *H01S 5/00*      (2006.01)
(52) U.S. Cl. ............... 372/46.01; 257/184; 257/607; 257/610
(58) Field of Classification Search ............ 372/46.01; 257/184, 607, 609, 610
See application file for complete search history.

(56) References Cited

U.S. PATENT DOCUMENTS

| 5,547,899 | A | * | 8/1996 | Fujii et al. ............ 438/40 |
|---|---|---|---|---|
| 5,559,820 | A | * | 9/1996 | Kimura et al. ........ 372/46.01 |
| 5,680,411 | A | * | 10/1997 | Ramdane et al. ........ 372/50.1 |
| 6,556,605 | B1 | | 4/2003 | Shtengel et al. |
| 7,122,846 | B2 | * | 10/2006 | Kish et al. ............ 257/96 |
| 2006/0054916 | A1 | | 3/2006 | Hanamaki |
| 2008/0049805 | A1 | * | 2/2008 | Takiguchi et al. ........ 372/46.01 |

FOREIGN PATENT DOCUMENTS

| GB | 2293485 A | 3/1996 |
|---|---|---|
| GB | 2364600 A | 1/2002 |
| JP | 6-37392 A | 2/1994 |
| JP | 2003-114407 A | 4/2003 |

OTHER PUBLICATIONS

E.W.A. Young et al; "Zinc-stimulated outdiffusion of iron in InP," Appl. Phys. Lett; vol. 56; No. 2; Jan. 8, 1990; pp. 146-147.
European Search Report dated Sep. 11, 2008, issued in corresponding European Patent Application No. 08152599.0.

* cited by examiner

*Primary Examiner*—Tod T Van Roy
(74) *Attorney, Agent, or Firm*—Westerman, Hattori, Daniels & Adrian, LLP

(57) ABSTRACT

In a p-type clad layer, not only a p-type dopant Zn but also Fe is doped. Its Zn concentration is $1.5 \times 10^{18}$ cm$^{-3}$ and the Fe concentration is $1.8 \times 10^{17}$ cm$^{-3}$. In a semi-insulating burying layer, Fe is doped as an impurity generating a deep acceptor level and the concentration thereof is $6.0 \times 10^{16}$ cm$^{-3}$. The Fe concentration in the p-type clad layer is thus three times higher than the Fe concentration in the burying layer.

12 Claims, 6 Drawing Sheets

SEMICONDUCTOR OPTICAL DEVICE AND MANUFACTURING METHOD THEREOF

CROSS-REFERENCE TO RELATED APPLICATIONS

This application is based upon and claims the benefit of priority from the prior Japanese Patent Application No. 2007-084593, filed on Mar. 28, 2007, the entire contents of which are incorporated herein by reference.

BACKGROUND OF THE INVENTION

1. Field of the Invention

The present invention relates to a semiconductor optical device favorable for a semiconductor laser and the like and a manufacturing method thereof.

2. Description of the Related Art

A Semi-Insulating Buried-Heterostructure (SIBH) is known as a current confinement structure in a semiconductor optical device such as a semiconductor laser. As another example of the current confinement structure, there is a structure, in which a mesa structure portion including an active layer is buried with a pnpn thyristor structure; however, the SIBH structure is more effective to reduce parasitic capacitance, which limits a modulation bandwidth. Accordingly, the SIBH is better to execute a modulation in a high bit-rate such as 10 Gb/s and 40 Gb/s.

In the SIBH structure, a mesa structure portion including an n-type InP clad layer, an active layer and a p-type InP clad layer is formed on an InP substrate having an n-type conductivity. The mesa structure portion is buried with a semi-insulating InP layer (burying layer). The semi-insulating InP layer used as the burying layer is an Fe-doped InP layer, and, since Fe generates a deep level, the resistance of the semi-insulating InP layer is high. In addition, Zn is used as a dopant of the p-type InP clad layer.

The SIBH structure has the above structure, but it is known that Zn in the p-type InP clad layer and Fe in the burying layer often cause an inter-diffusion. In other words, Zn diffuses from the p-type InP clad layer into the burying layer and Fe diffuses from the burying layer into the p-type InP clad layer. Such a phenomenon is described in, for example, non-Patent Document 1 (E. W. A. Young, et. al., "Zinc-stimulated out-diffusion of iron in InP", Appl. Phys. Lett., 56, pp 146, 1990). Also, Patent Document 1 (Japanese Patent No. 3257045 (Japanese Patent Application Laid-Open No. Hei 6-37392)) discloses results of secondary ion mass spectrometry (SIMS) of Fe and Zn, regarding the above inter-diffusion.

When such an inter-diffusion of Fe and Zn occurs, an insulation performance of an area in the burying layer near its interface with the p-type InP clad layer is deteriorated and this causes an increase in a leakage current in burying layer. As a result, an efficiency of carrier injection to the active layer is decreased so that problems such as an increase in threshold current and deteriorations of optical output characteristics may occur. Further, in an electroabsorption modulator, a parasitic capacitance is increased and modulation bandwidth may be narrowed.

In view of these problems, Patent Document 1 describes a technique for doping not only Zn but also Fe to the p-type InP clad layer in the same concentration with that of the burying layer, in order to suppress the inter-diffusion. In other words, it describes a technique, in which the same Fe concentration of $6 \times 10^{16}$ cm$^{-3}$ is applied to both the p-type InP clad layer and the burying layer. Using this technique, since the Fe in the burying layer hardly diffuses into the p-type InP clad layer, the inter-diffusion can be suppressed. As a result, a high insulation performance of the burying layer is maintained and a leakage of current in the burying layer is suppressed so that a superior optical output characteristic can be obtained. According to the Patent Document 1, a desired object is attained as described above.

In contrast, a demand for a further lowered resistance in the semiconductor optical devices such as a semiconductor laser has been increased and it has been studied to increase the impurity concentration in the p-type InP clad layer. The Zn concentration (impurity concentration) in the p-type InP clad layer in Patent Document 1 is $5 \times 10^{17}$ cm$^{-3}$; however, recently, it is assumed that a preferable concentration is $1.0 \times 10^{18}$ cm$^{-3}$ or more.

However, according to results of an experiment conducted by the inventors of the present application, it is found that the inter-diffusion of Fe and Zn cannot be sufficiently suppressed when the Zn concentration in the p-type InP clad layer is made $1.0 \times 10^{18}$ cm$^{-3}$ or more with the technique described in Patent Document 1. The details will be described later.

Related art is described in Patent Document 2 (Japanese Patent Application Laid-Open No. 2003-114407 (paragraphs 0008-0009, FIG. 9)).

SUMMARY OF THE INVENTION

According to an aspect of an embodiment, there is a semiconductor optical device including: a semiconductor substrate; a mesa portion formed on the semiconductor substrate and including a p-type semiconductor layer to which a p-type impurity is added; and a burying layer burying the mesa portion and made of a group III-V compound semiconductor to which an impurity generating a deep acceptor level is added. The p-type semiconductor layer has a higher concentration of the impurity generating a deep acceptor level, compared to the burying layer.

According to an aspect of another embodiment, there is a semiconductor optical device manufacturing method including, a mesa portion is formed on a semiconductor substrate, and then, a burying layer burying the mesa portion is formed. The mesa portion includes a p-type semiconductor layer to which a p-type impurity is added. The burying layer is made of a group III-V compound semiconductor to which an impurity generating a deep acceptor level is added. A layer having a higher concentration of the impurity generating a deep acceptor level, compared to the burying layer, is formed as the p-type semiconductor layer.

DETAILED DESCRIPTION OF THE PREFERRED EMBODIMENTS

Embodiments of the present invention will be described in detail with reference to the drawings.

First Embodiment

Figure 1:
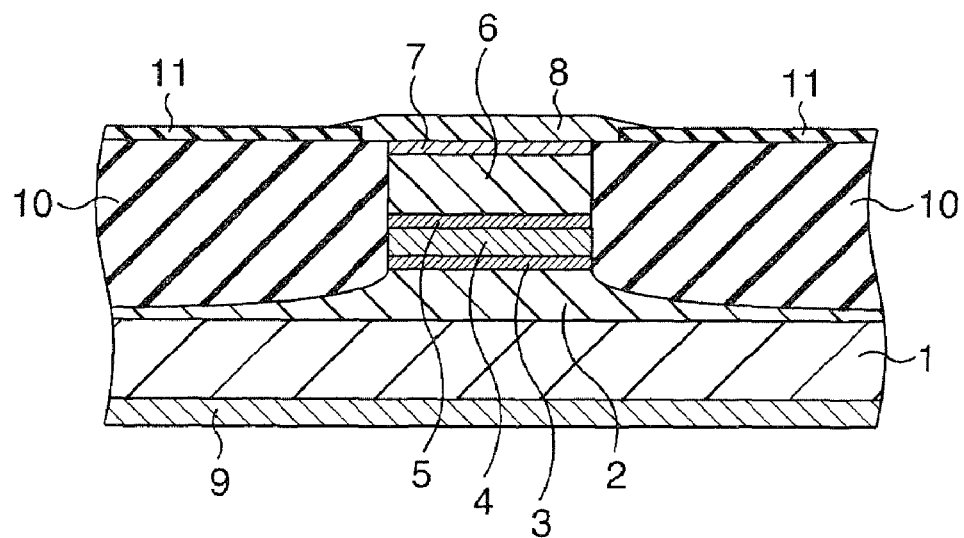
FIG. 1 is a sectional diagram showing a configuration of a semiconductor laser according to a first embodiment of the present invention.

A semiconductor laser according to a first embodiment of the present invention will be described. The semiconductor laser is a semiconductor laser with wavelength of 1.55 μm band to which an SIBH structure is applied. FIG. 1 is a sectional diagram showing the semiconductor laser according to the first embodiment of the present invention.

In the semiconductor laser, as shown in FIG. 1, an n-type clad layer 2 made of n-type InP is formed on an n-type substrate 1 made of n-type InP. On the n-type clad layer 2, an optical guide layer 3 made of undoped InGaAsP, a multiple quantum well active layer 4 made of InGaAsP-series material and having a gain in a 1.55 μm band, and an optical guide layer 5 made of undoped InGaAsP are layered. On the optical guide layer 5, a p-type clad layer 6 made of p-type InP or the like and a p⁺ contact layer 7 made of p⁺-InGaAsP are layered. The configuration of a layered stack composed of the p⁺ contact layer 7, the p-type clad layer 6, the optical guide layer 5, the multiple quantum well active layer 4, the optical guide layer 3 and the n-type clad layer 2 is made as a mesa structure by an etching process. This structure forms a mesa portion. A semi-insulating burying layer 10 is then provided around the layered stack (mesa portion). The burying layer 10 contains Fe as an impurity generating a deep acceptor level.

The thickness of the optical guide layers 3 and 5 is, for example, about 50 nm and their composition is 1.15 μm. In this specification, the composition of compound semiconductor is described using a wavelength obtained based on its bandgap. Further, in the multiple quantum well active layer 4, for example, well layers made of InGaAsP having a thickness of 5.0 nm and a compressive strain of 0.8% and barrier layers made of lattice-matched InGaAsP having a thickness of 10 nm and a composition of 1.3 μm are layered alternatively. The number of the well layers is 6, for example.

The thickness of the p-type clad layer 6 is, for example, 1.5 μm and not only Zn of p-type dopant but also Fe is doped thereto. The concentration of Zn is $1.5 \times 10^{18}$ cm$^{-3}$ and the concentration of Fe is $1.8 \times 10^{17}$ cm$^{-3}$, for example. The thickness of the p⁺ contact layer 7 is, for example, 300 nm. The concentration of Fe in the semi-insulating burying layer 10 is $6.0 \times 10^{16}$ cm$^{-3}$, for example. That is, the concentration of Fe in the p-type clad layer 6 is three times higher than the concentration of Fe in the burying layer 10.

On the burying layer 10, an insulation film 11 made of SiO$_2$ or the like and exposing the p⁺ contact layer 7 is formed. Further, an electrode 8 contacting with the p⁺ contact layer 7 and an electrode 9 contacting with a rear face of the n-type substrate 1 are formed.

In the semiconductor laser having such a structure, since the concentration of Fe doped in the p-type clad layer 6 is higher than the concentration of Fe doped in the burying layer 10, an inter-diffusion of Fe and Zn is suppressed. Thus, leakage current is suppressed while reducing the resistance so that a superior optical output characteristic can be obtained. In other words, since the concentration of Fe doped in the p-type clad layer 6 is higher than the concentration of Fe doped in the burying layer 10, an inter-diffusion of Fe and Zn can be sufficiently suppressed although the p-type clad layer 6 has a high Zn concentration, which is $1.5 \times 10^{18}$ cm$^{-3}$.

Figure 5A:
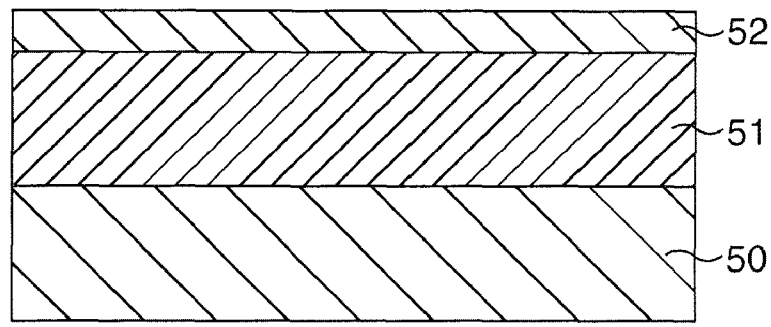
FIG. 5A is a sectional diagram showing samples produced in an experiment.
Figure 5B:
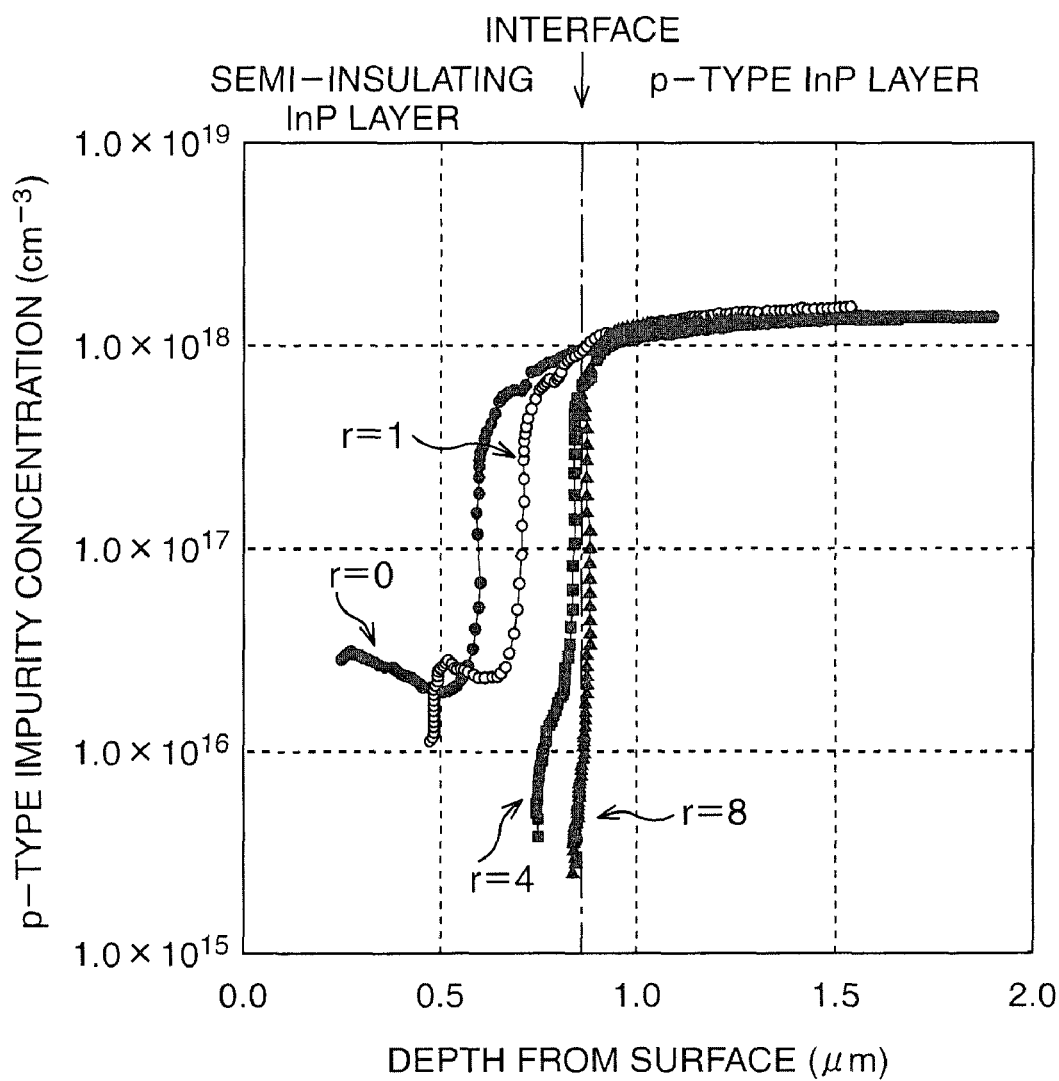
FIG. 5B is a graph showing results of the experiment.

Hereinafter, contents and results of experiments actually conducted by the inventors of the present application will be described. In this experiment, samples of four types were produced. In producing those samples, a p-type InP layer 51 and a semi-insulating InP layer 52 were formed on an n-type InP substrate 50 in order, as shown in FIG. 5A. The semi-insulating InP layer 52 was a layer containing Fe in a concentration of $6.0 \times 10^{16}$ cm$^{-3}$. The p-type InP layer 51 was a layer containing Zn in a concentration of $1.5 \times 10^{18}$ cm$^{-3}$ and Fe in a concentration shown in Table 1. The concentration ratios r in Table 1 represent the ratio of the Fe concentration in the p-type InP layer 51 with respect to the Fe concentration in the semi-insulating InP layer 52. Then, the concentrations of p-type impurity in those four samples were measured. The results are shown in FIG. 5B. In this experiment, the p-type impurity concentration is substantially equal to the Zn concentration.

TABLE 1

| Sample No. | Fe Concentration | Concentration Ratio r |
|---|---|---|
| 1 | 0 | 0 |
| 2 | $6.0 \times 10^{16}$ cm$^{-3}$ | 1 |
| 3 | $2.4 \times 10^{17}$ cm$^{-3}$ | 4 |
| 4 | $4.8 \times 10^{17}$ cm$^{-3}$ | 8 |

As shown in FIG. 5B, in case of sample No. 1 of r 0, the p-type impurity concentration was steeply changed from mid-$10^{17}$ cm$^{-3}$ to mid-$10^{16}$ cm$^{-3}$ at a position in the semi-insulating InP layer 52, where is about 0.28 μm spaced from the interface between the p-type InP layer 51 and the semi-insulating InP layer 52. The p-type impurity concentration was in low-$10^{16}$ cm$^{-3}$ in an area farther spaced from the interface. According to this result, it can be considered that the Zn atoms doped in the p-type InP layer 51 diffused into those areas. Here, a mechanism of the diffusion will be studied.

In the sample No. 1, it can be considered that the Zn atoms existed as interstitial atoms (impurity atoms entered into spaces where atoms are not filled) in the p-type InP layer 51 and the Fe atoms in the semi-insulating InP layer 52 diffused as exchanging their positions, when the semi-insulating InP layer 52 was formed. In this inter-diffusion, it is likely that the Zn atoms diffused until its concentration became as the same level as the Fe concentration in the semi-insulating InP layer 52. This phenomenon is verified in Patent Document 1 and it also occurs when the Zn concentration in the p-type InP layer 51 is low. This diffusion seems to a diffusion of Zn atoms within an area spaced 0.28 μm or more from the interface.

Further, in the sample No. 1, since the Zn concentration in the p-type InP layer 51 is much higher than that of the p-type clad layer described in Patent Document 1, a considerable number of interstitial atoms exist in the p-type InP layer 51, and the atoms are diffused into the semi-insulating InP layer 52 rapidly. Then, it seems that, in the semi-insulating InP layer 52, the Zn atoms were introduced into In vacancies or introduced into lattice sites by pushing Indium out of the lattice sites, and that the Zn atoms became substitutional impurity atoms (impurity atoms occupying lattice sites). In this way, it is considered that, because of such an excessive diffusion of the interstitial atoms (Zn atoms), the number of substitutional impurity atoms (Zn atoms) inserted into the lattice sites in the semi-insulating InP layer 52 is increased. This diffusion seems to be a diffusion of Zn atoms within an area near the interface.

As described above, in the sample No. 1, since a great number of Zn atoms were diffused into the semi-insulating InP layer 52, a leakage current is increased and an optical output characteristic is deteriorated.

In case of sample No. 2, Fe in the same concentration was doped to the p-type InP layer 51 and the semi-insulating InP layer 52 but the Zn concentration in the p-type InP layer 51 was much higher than the p-type clad layer described in Patent Document 1. Thus, as shown in FIG. 5B, a diffusion of Zn atoms into the semi-insulating InP layer 52 was observed although the degree of the diffusion was reduced compared to the case of sample No. 1. As a result, in case of the sample No. 2, also, a leakage current is increased and an optical output characteristic is deteriorated.

On the other hand, in case of sample No. 3, since the concentration of Fe doped in the p-type InP layer 51 was four times higher than that in the semi-insulating InP layer 52, a diffusion of Zn atoms into the semi-insulating InP layer 52 was remarkably suppressed, as shown in FIG. 5B. That is, the p-type impurity concentration profile, which is substantially equal to the concentration profile of Zn atoms, was steep near the interface between the p-type InP layer 51 and the semi-insulating InP layer 52. Thus, in case of the sample No. 3, a leakage current is suppressed and a superior optical output characteristic is obtained.

In case of sample No. 4, since the concentration of Fe doped in the p-type InP layer 51 was eight times higher than that in the semi-insulating InP layer 52, a diffusion of Zn atoms into the semi-insulating InP layer 52 was further suppressed, as shown in FIG. 5B. Thus, also in case of the sample No. 4, a leakage current is suppressed and a superior optical output characteristic is obtained.

According to these results, inter-diffusion of Fe and Zn can be suppressed when Fe with higher concentration is doped in the p-type InP layer 51 than the semi-insulating InP layer 52. Then, compared to the first embodiment, since the p-type InP layer 51 corresponds to the p-type clad layer 6, and the semi-insulating InP layer 52 corresponds to the burying layer 10, the experiment results proved the suppression of the inter-diffusion of Fe and Zn in the first embodiment.

Figure 6:
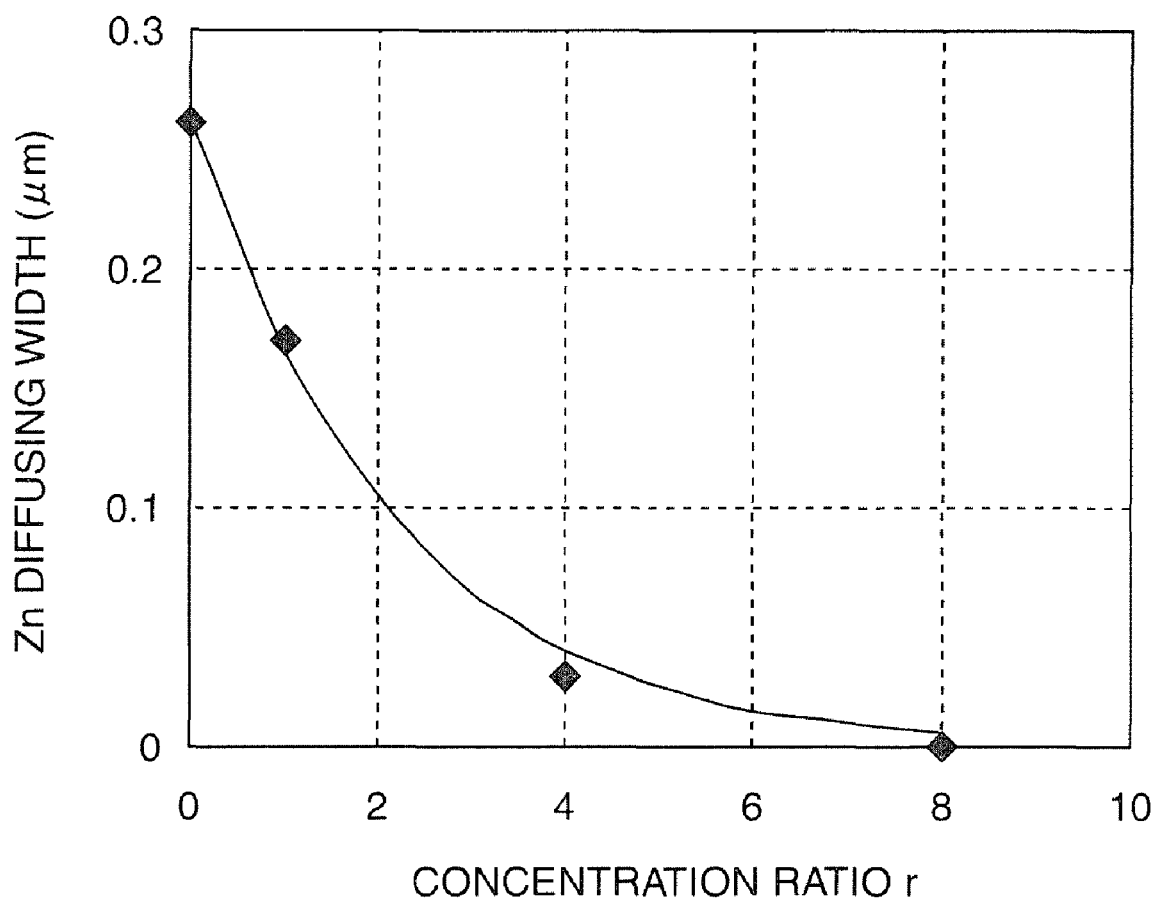
FIG. 6 is a graph showing a relation of concentration ratios r and Zn diffusing widths.

Further, based on the graph shown in FIG. 5B, assuming a width of an area in which the Zn atoms became substitutional impurity atoms in the semi-insulating InP layer 52 from the interface as a Zn diffusing width, when a relation between the Zn diffusing width and the concentration ratio r is illustrated, a graph in FIG. 6 is obtained. In order to reduce a leakage current, preferably, the Zn diffusing width is made 0.1 μm or less. According to the graph in FIG. 6, the Zn diffusing width can be suppressed within in the range when the concentration ratio r is 2 or more. Further, according to the graph in FIG. 6, the Zn diffusing width seems to be reduced as the concentration ratio r becomes larger; however, in case of the sample No. 4 (r=8), introduction of the Fe atoms into the lattice site reached a saturated state and a part of the Fe atoms precipitated in the p-type InP layer 51. With this result, the effect of the present invention can be saturated even if the concentration ratio r is set more than 8. The concentration ratio r is thus preferable to be from 2 to 8.

A method for manufacturing the semiconductor laser according to the first embodiment will be described. FIGS. 2A to 2F are sectional diagrams showing a method for manufacturing the semiconductor laser according to the first embodiment in order of the procedure.

Figure 2A:
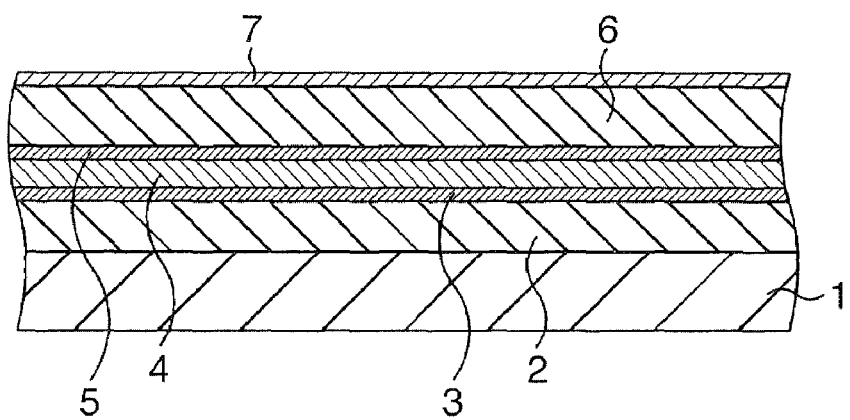
FIGS. 2A to 2F are sectional diagrams showing a method for manufacturing the semiconductor laser according to the first embodiment in order of the procedure.

As shown in FIG. 2A, using a Metal-Organic Vapor Phase Epitaxy method (MOVPE method), the n-type clad layer 2, the optical guide layer 3, the multiple quantum well active layer 4, the optical guide layer 5, the p-type clad layer 6 and the p$^+$ contact layer 7 are formed on the n-type substrate 1. When the p-type clad layer 6 is formed, Zn in a concentration of $1.5 \times 10^{18}$ cm$^{-3}$ and Fe in concentration of $1.8 \times 10^{17}$ cm$^{-3}$ are doped.

Figure 2B:
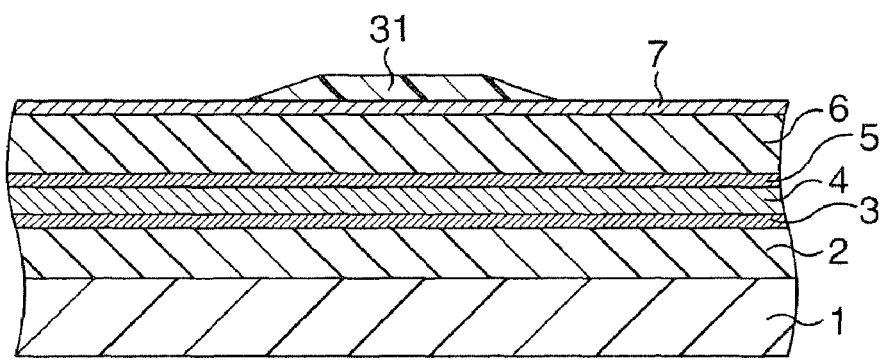

Then, as shown in FIG. 2B, a striped mask 31 is formed on the p$^+$ contact layer 7.

Figure 2C:
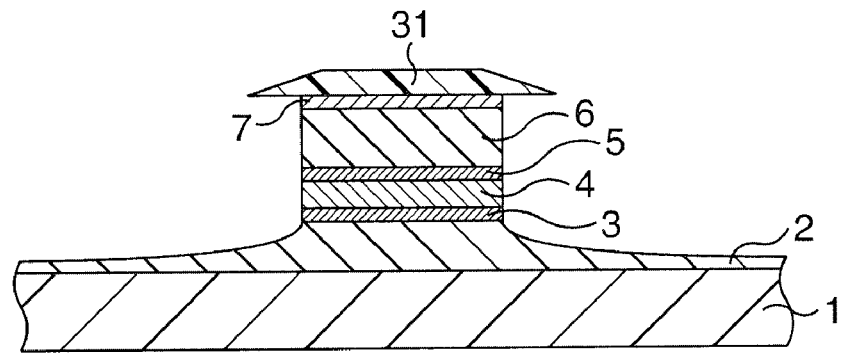

Thereafter, using the mask 31, an etching such as an Inductive Coupled Plasma Reactive Ion Etching (ICP-RIE) is executed. As a result, as shown in FIG. 2C, a mesa structure is made with a layered stack composed of the p$^+$ contact layer 7, the p-type clad layer 6, the optical guide layer 5, the multiple quantum well active layer 4, the optical guide layer 3 and the n-type clad layer 2.

Figure 2D:
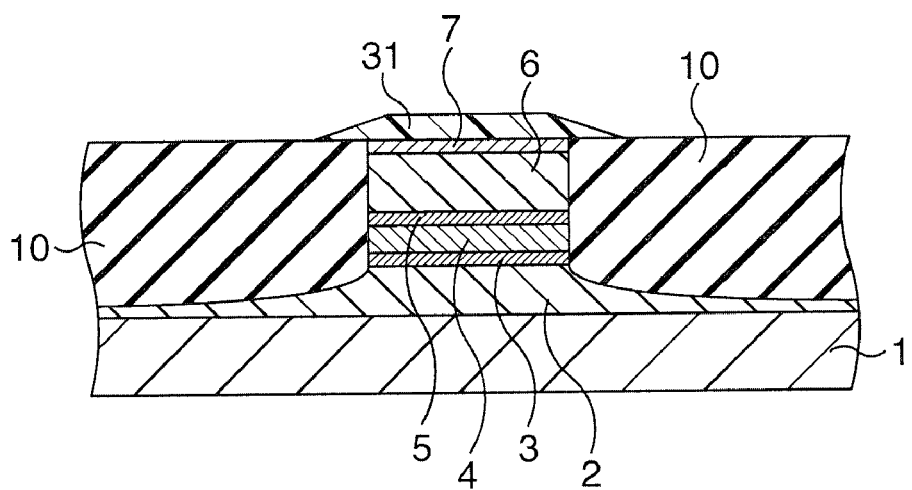

Next, as shown in FIG. 2D, a semi-insulating burying layer 10 is provided around the layered stack of the mesa structure. With this procedure, a current confinement structure is obtained. Here, when the burying layer 10 is formed, Fe in a concentration of $6.0 \times 10^{16}$ cm$^{-3}$ is doped. That is, the concentration ratio r is made to be 3.

Figure 2E:
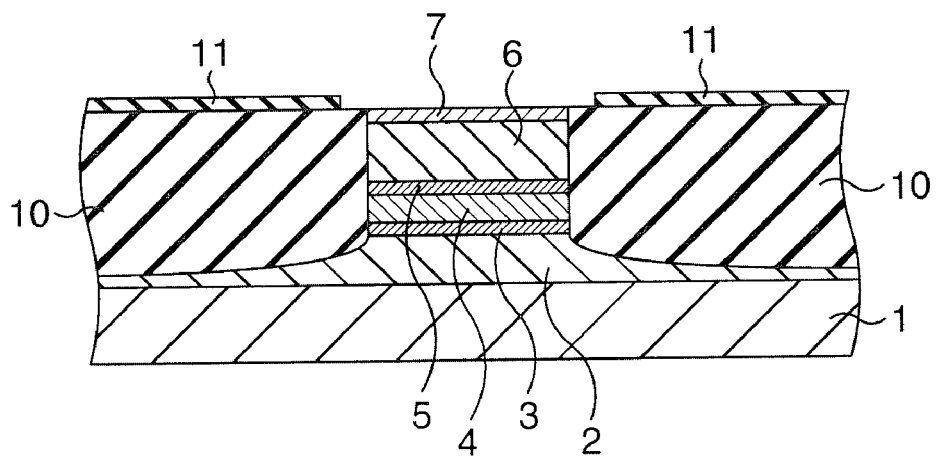

Then, as shown in FIG. 2E, the mask 31 is removed and the insulation film 11 exposing the p$^+$ contact layer 7 is formed.

Figure 2F:
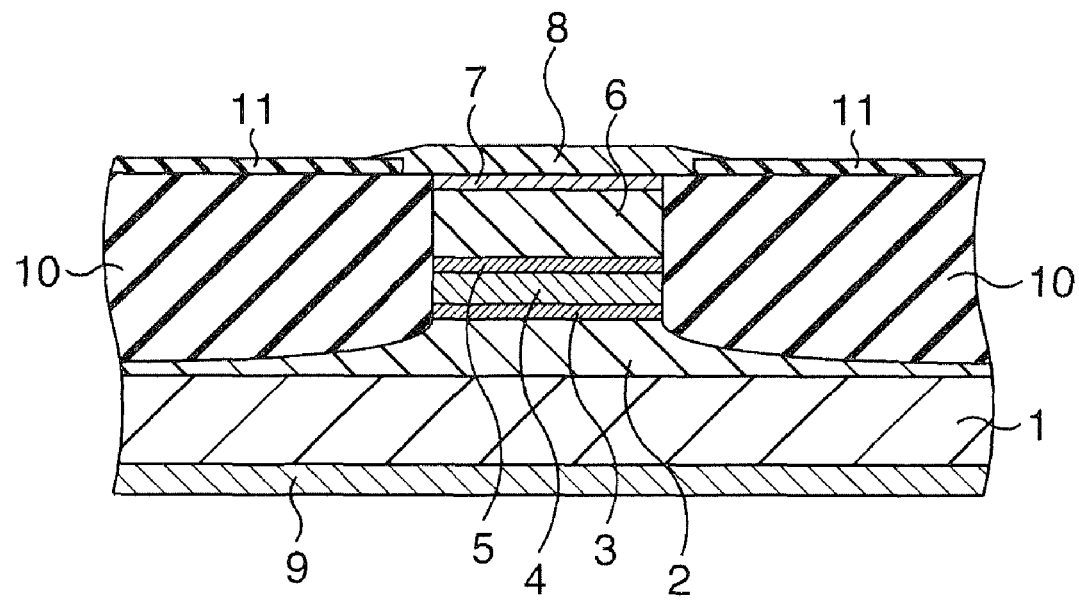

Thereafter, as shown in FIG. 2F, the electrode 8 contacting with the p$^+$ contact layer 7 and the electrode 9 contacting with the rear face of the n-type substrate 1 are formed.

In this explanation of the manufacturing method, the concentration ratio r is made to be 3; however, the concentration ratio r can be any number if it is greater than 1 and, preferably, from 2 to 8.

Second Embodiment

Figure 3:
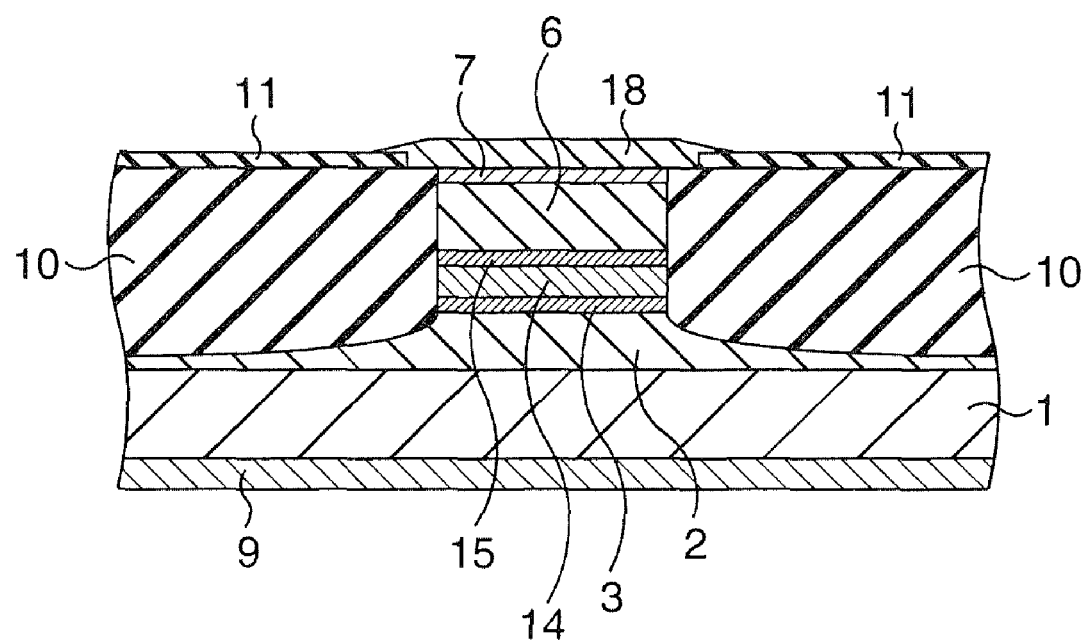
FIG. 3 is a sectional diagram showing a configuration of an EA modulator according to a second embodiment of the present invention.

An electro-absorption modulator (EA modulator) according to a second embodiment of the present invention will be described. FIG. 3 is a sectional diagram showing the EA modulator according to the second embodiment of the present invention.

In this EA modulator, as shown in FIG. 3, a light absorption layer 14 made of InGaAsP-series material is provided as a substitute for the quantum well active layer active layer 4 in the first embodiment, and an optical guide layer 15 made of undoped InGaAsP is provided as a substitute for the optical guide layer 5 in the first embodiment. In the light absorption layer 14, for example, well layers made of InGaAsP having a thickness of 9.0 nm and a compressive strain of 0.5% and barrier layers made of InGaAsP having a thickness of 5.0 nm, a composition of 1.3 μm and tensile strain of 0.3% are layered alternatively. In other words, the light absorption layer 14 has a multiple quantum well structure. The number of the well layers is 6, for example. Here, although the transition wavelength of the multiple quantum well structure in the light absorption layer 14 is not limited, when an input wavelength is 1.55 μm, for example, the transition wavelength can be set about from 1.49 μm to 1.50 μm. Further, the thickness of the optical guide layer 15 is 50 nm and its composition is continuously changing between 1.15 μm and 1.00 μm, for example. In other words, the composition of the optical guide layer 15 at the interface with the light absorption layer 14 is 1.15 μm, the composition of the optical guide layer 15 at the interface with the p-type clad layer 6 is 1.00 μm, and accordingly, the optical guide layer 15 is a graded layer. Other structures are same as those in the first embodiment.

In the EA modulator having the above structure, also, since the Fe concentration is higher in the p-type clad layer 6 than the burying layer 10, an inter-diffusion of Fe and Zn is suppressed. Thus, a wide bandwidth can be assured as reducing the resistance and a superior modulation characteristic can be obtained.

Third Embodiment

Figure 4:
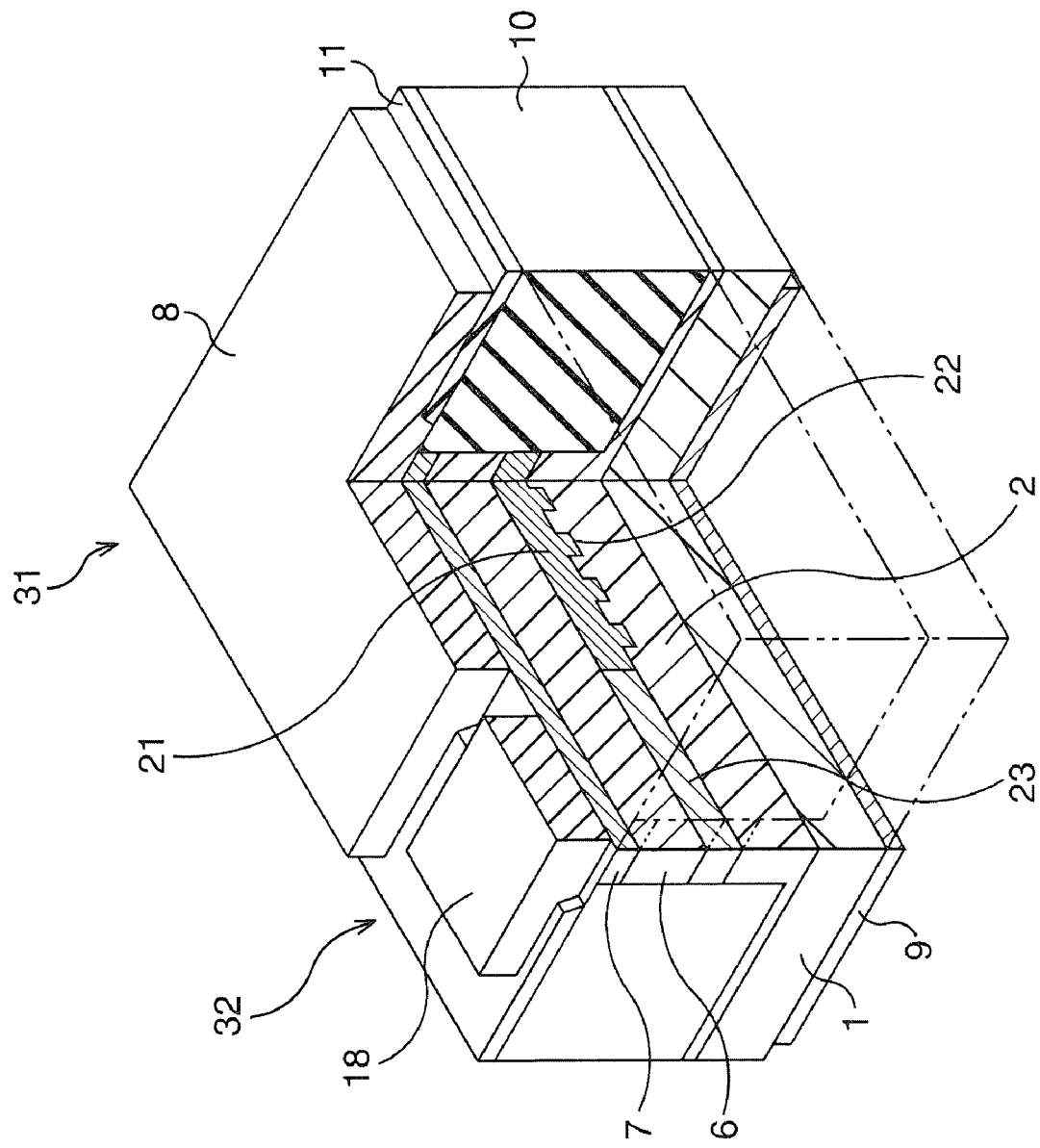
FIG. 4 is a partially sectional diagram showing a configuration of a modulator-integrated semiconductor laser according to a third embodiment of the present invention.

A modulator-integrated semiconductor laser according to a third embodiment of the present invention will be described. FIG. 4 is a partially sectional diagram showing a configuration of the modulator-integrated semiconductor laser according to the third embodiment of the present invention.

In this modulator-integrated semiconductor laser, as shown in FIG. 4, a semiconductor laser 31 same as the first embodiment and an EA modulator 32 same as the second embodiment are integrated by a butt-joint connection. Here, in the semiconductor laser 31, a light emitting portion 21 composed of the optical guide layer 3, the multiple quantum well active layer 4 and the optical guide layer 5 are formed and a diffraction grating 22 is formed at the bottom of the light emitting portion 21. The semiconductor laser 31 thus oscillates in a single mode. Further, in the EA modulator 32, a modulation unit 23 composed of the optical guide layer 3, the light absorption layer 14 and the optical guide layer 15 are formed.

According to the modulator-integrated semiconductor laser having such a configuration, the effects of the both first and second embodiments can be obtained. In other words, a superior optical output characteristic and wide modulation bandwidth can be attained while reducing the resistance.

In the first and third embodiments, the multiple quantum well active layer 4 having a gain in 1.55 μm band is made of $In_{1-x}Ga_xAs_yP_{1-y}$-series ($0 \leq x$, $y \leq 1$) material; however, it can be made of other materials such as $In_xGa_yAl_{1-x-y}As$-series ($0 \leq x$, $y \leq 1$) material. In this case, in the multiple quantum well active layer 4, for example, well layers made of InGaAlAs having a thickness of 5.0 nm and a compressive strain of 1.0% and barrier layers made of InGaAlAs having a thickness of 10 nm, a composition of 1.2 μm and a tensile strain of 0.3% are layered alternatively. The number of the well layers is 6, for example.

Further, for example, a layer made of undoped InGaAlAs having a thickness of 50 nm and a composition 1.2 μm is used as the optical guide layer 3 under the multiple quantum well active layer 4. Furthermore, for example, a layer made of undoped InGaAsP having a thickness of 50 nm and a composition of 1.05 μm is used as the optical guide layer 5 on the multiple quantum well active layer 4.

According to the semiconductor laser having such a multiple quantum well active layer 4 made of InGaAlAs-series material, a band offset of a conduction band in the quantum well structure is larger, compared to the first embodiment having a multiple quantum well active layer 4 made of InGaAsP-series material. Thus, compared to the first embodiment, the electron confinement is improved and superior high-temperature characteristics are obtained.

Here, in the EA modulator and the like, $In_xGa_yAl_{1-x-y}As$-series ($0 \leq x$, $y \leq 1$) material can be employed.

Further, the p-type impurity added to the p-type clad layer 6 is not limited to Zn, and Cd and/or Mg can be added, for example. The concentrations of those p-type impurities are preferably equal to or more than $1.0 \times 10^{18}$ cm$^{-3}$ in order to reduce the resistance. Further, the impurity generating a deep acceptor level added to the burying layer 10 and p-type clad layer 6 is not limited to Fe, and Co and/or Cu can be added.

Also, a GaAs layer or the like can be included as a part of the p-type clad layer 6 and the burying layer 10. When the p-type clad layer 6 and the burying layer 10 are formed, for example, only an InP layer can be formed, or a thin GaAs may be formed first and an InP layer may be formed thereon.

The above embodiments relate to semiconductor optical devices (semiconductor laser and semiconductor EA modulator) having a burying layer and a mesa portion including a p-type semiconductor layer formed on a semiconductor substrate; however, the present invention is not limited to the structure. The present invention can be applied to, for example, a semiconductor optical device having the same structure as a semiconductor optical amplifier and a Mach-Zehnder type optical modulator.

According to the present invention, since an impurity in a higher concentration is applied to a p-type semiconductor layer than a burying layer, unnecessary diffusions of p-type impurity in the p-type semiconductor layer can be suppressed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor optical device comprising:
   a semiconductor substrate;
   a mesa portion formed on said semiconductor substrate and including a p-type semiconductor layer to which a p-type impurity is added; and
   a burying layer burying said mesa portion and made of a group III-V compound semiconductor to which an impurity generating a deep acceptor level is added,
   wherein said p-type semiconductor layer has a higher concentration of the impurity generating a deep acceptor level, compared to said burying layer; and
   a concentration of the impurity forming a deep acceptor level in the p-type semiconductor layer is 2 to 8 times higher than a concentration of the impurity forming a deep acceptor level in said burying layer.

2. The semiconductor optical device according to claim 1, wherein a concentration of the p-type impurity in the p-type semiconductor layer is equal to or greater than $1.0 \times 10^{18}$ cm$^{-3}$.

3. The semiconductor optical device according to claim 1, wherein the p-type impurity is at least one type selected from a group consisting of Zn, Cd and Mg.

4. The semiconductor optical device according to claim 1, wherein the p-type semiconductor layer is made of a group III-V compound semiconductor.

5. The semiconductor optical device according to claim 1, wherein said burying layer comprises at least an InP layer.

6. The semiconductor optical device according to claim 1, wherein the p-type semiconductor layer comprises at least an InP layer.

7. The semiconductor optical device according to claim 1, wherein the impurity forming a deep acceptor level is at least one type selected from a group consisting of Fe, Co and Cu.

8. The semiconductor optical device according to claim 1, wherein said semiconductor substrate is an InP substrate having an n-type conductivity.

9. The semiconductor optical device according to claim 1, wherein said mesa portion comprises an active layer made of $In_{1-x}Ga_xAs_yP_{1-y}$-series($0 \leq x$, $y \leq 1$) material or $In_xGa_yAl_{1-x-y}As$-series ($0 \leq x$, $y \leq 1$) material.

10. The semiconductor optical device according to claim 1, which serves as a semiconductor laser.

11. The semiconductor optical device according to claim 1, which serves as an electro-absorption semiconductor optical modulator.

12. The semiconductor optical device according to claim 1, which serves as an integrated electro-absorption semiconductor optical modulator and a semiconductor laser.

* * * * *